United States Patent
Friebe et al.

(10) Patent No.: US 8,094,475 B2
(45) Date of Patent: Jan. 10, 2012

(54) INVERTER WITH ASYMMETRIC CLOCKING AND THERMALLY ISOLATED MODULES

(75) Inventors: Jens Friebe, Noerten-Hardenberg (DE); Regine Mallwitz, Kassel (DE); Peter Zacharias, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 406 days.

(21) Appl. No.: 12/477,948

(22) Filed: Jun. 4, 2009

(65) Prior Publication Data

US 2009/0316457 A1    Dec. 24, 2009

(30) Foreign Application Priority Data

Jun. 18, 2008  (EP) .................... 08011019

(51) Int. Cl.
*H02M 7/5387*    (2007.01)
(52) U.S. Cl. ...................... 363/132; 363/141
(58) Field of Classification Search .......... 363/132, 363/141
See application file for complete search history.

(56) References Cited

U.S. PATENT DOCUMENTS

| | | |
|---|---|---|
| 2005/0286281 A1 | 12/2005 | Victor et al. |
| 2006/0180835 A1 | 8/2006 | Sellmair |
| 2009/0207639 A1* | 8/2009 | Tanaka et al. ............. 363/141 |
| 2009/0316457 A1* | 12/2009 | Friebe et al. ............. 363/131 |
| 2011/0133664 A1* | 6/2011 | Imam et al. ............. 315/283 |

FOREIGN PATENT DOCUMENTS

| | | |
|---|---|---|
| DE | 100 20 537 A1 | 12/2001 |
| DE | 10 2004 030 912 B3 | 1/2006 |
| DE | 10 2004 063 277 A1 | 7/2006 |
| EP | 1 369 985 A | 12/2003 |
| JP | 2005 051926 A | 2/2005 |
| WO | 2008 015 298 A1 | 2/2008 |

OTHER PUBLICATIONS

Round, S. et al.; "A SiC JFET driver for a 5 kW, 150 kHz three-phase PWM converter"; Industry Applications Conference 2005, Foutieth IAS Annual Meeting; Conference Record of the 2005 Hong KongOct. 2005; pp. 410-416.
Caiais M. et al.; "Multilevel converters for single-phase grid connected photovoltaic systems: an overview"; Solar Energy; Pergamon Press, Oxford, GB; vol. 66; No. 5; Aug. 1999; pp. 325-335.
Choi, et al. "Grid-Connected Photovoltaic Inverter with Zero-Current-Switching", Summer Conference Papers of the Korean Institute of Electrical Engineers, Jul. 1, 2000, p. 953-955.
Choi, et al., "PWM Inverter for Reducing Switching Loss", Fall Conference Papers of the Korean Institute of Electrical Engineers, Oct. 15, 2004, p. 207-209.

* cited by examiner

*Primary Examiner* — Jeffrey Sterrett
(74) *Attorney, Agent, or Firm* — Eschweiler & Associates, LLC

(57) ABSTRACT

On an inverter for feeding power of a direct voltage source, in particular of a photovoltaic generator (PVG), into an alternating voltage mains (N), with an asymmetrically clocked bridge circuit with at least two first switches (S1, S2) clocked at mains frequency and with at least two second switches (S3, S4) clocked at a higher clock frequency, the efficiency is intended to be improved at low cost. This is achieved in that slow speed switches (S1, S2) of equal temperature stability are utilized for the mains frequency and that fast speed switches (S3, S4) with steeper switching slopes and higher temperature stability are utilized for the higher clock frequency, the fast speed switches (S3, S4) being locally separated from the slow speed switches (S1, S2).

25 Claims, 16 Drawing Sheets

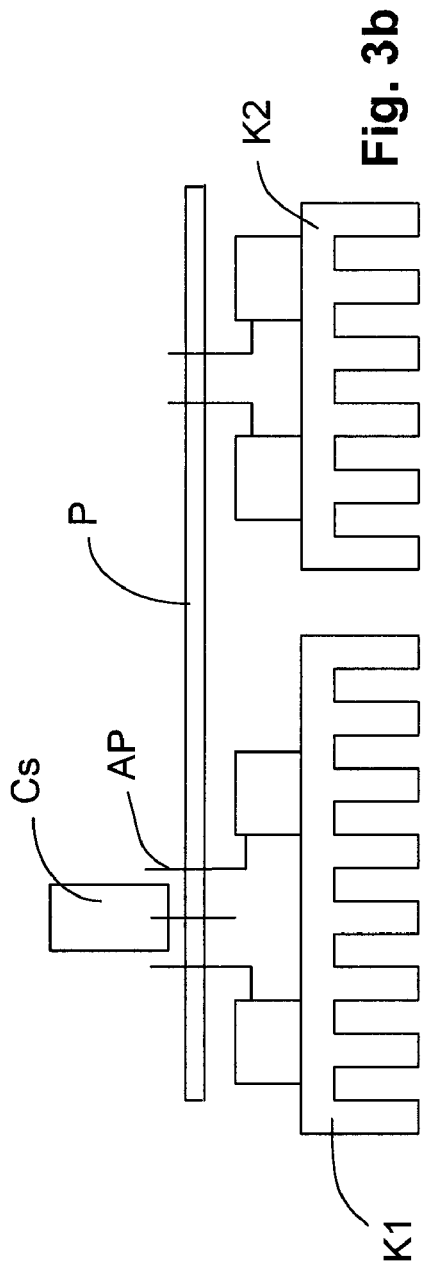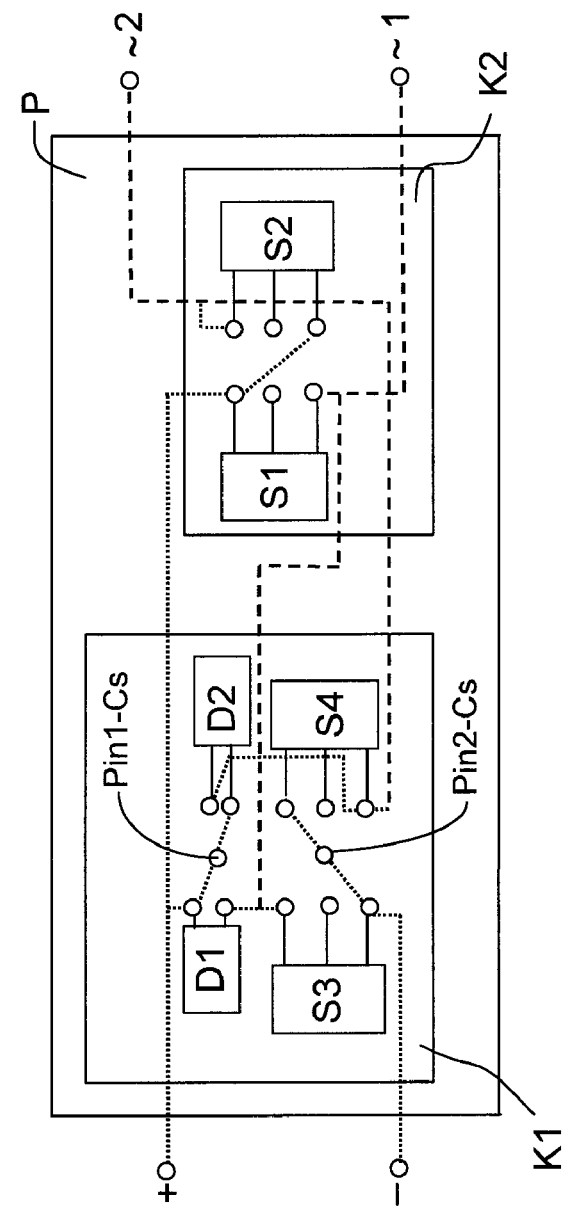

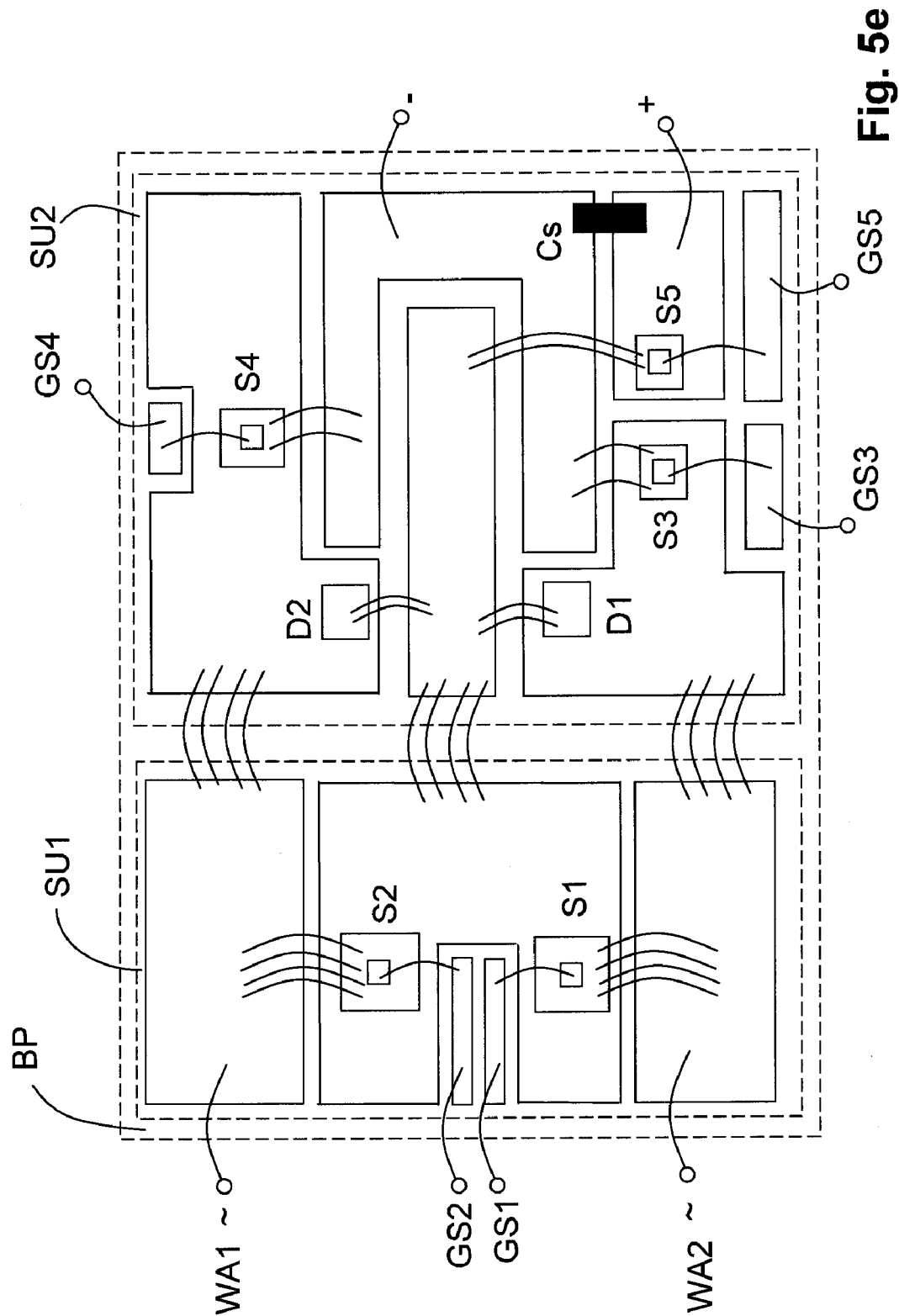

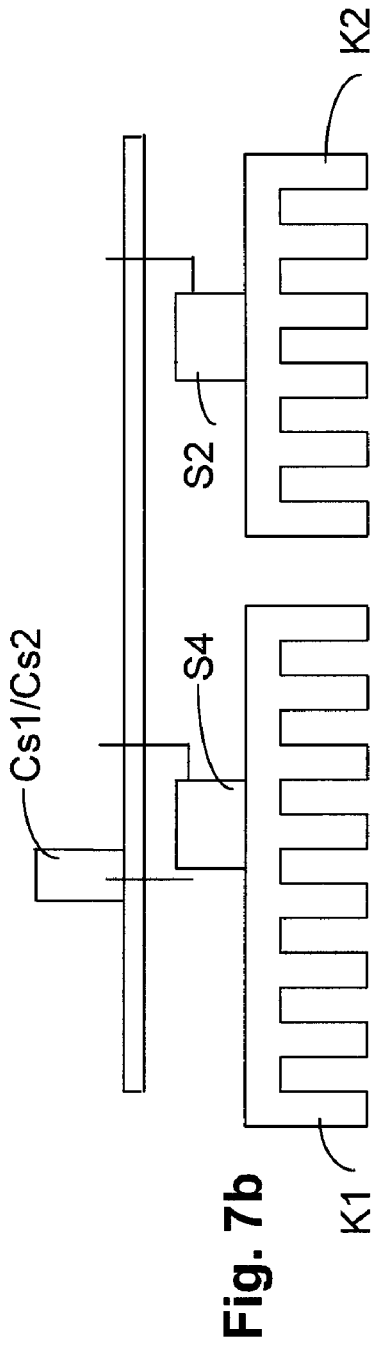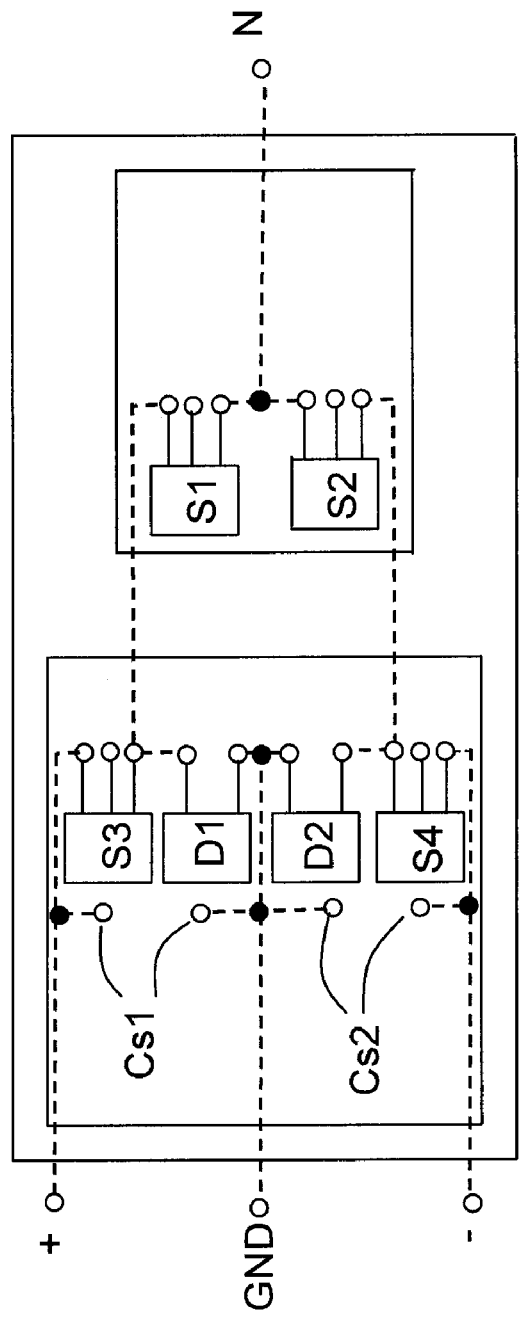
Fig. 7b
Fig. 7a

INVERTER WITH ASYMMETRIC CLOCKING AND THERMALLY ISOLATED MODULES

BACKGROUND OF THE INVENTION

The invention relates to an inverter for feeding power of a direct voltage source, in particular of a photovoltaic generator, into an AC voltage mains, with an asymmetrically clocked bridge circuit having at least two first switches clocked at mains frequency and at least two second switches clocked at a higher clock rate.

Inverters in full bridge circuit are known. They can be implemented as one-phase or as three-phase full bridges for feeding into a grid. Each bridge branch consists of two switches in the event of one-phase feeding. A mains choke is located in the AC lines. In principle, the switches of the bridge circuit can be connected symmetrically or asymmetrically.

In order to decouple the arrangement from the DC side, the document DE 10 2004 030 912 B3 proposes to connect a fifth switch between the positive pole of the DC source and the two bridge branches. This additional, fifth switch is connected at high frequency and simultaneously to a respective one of the two lower switches of the bridge branches, whilst a respective one of the upper switches of the bridge branches is closed for each half wave of the mains voltage. Here, the switches are clocked asymmetrically.

Another arrangement is known from WO 2008 015 298 A1. This document describes a full bridge array with a divided intermediate circuit at the input. In each DC line between an intermediate circuit and a bridge, there is one series-connected switch. These switches are alternatively clocked at high frequency but at the same time with a respective one of the two lower switches of the bridge branches whilst a respective one of the upper switches of the bridge branches is closed for each half wave of the mains voltage. Clocking is also asymmetric here. An additional freewheel path is formed from two series connected diodes that are connected upstream of the bridge and the center tap of which is connected to the center tap of the intermediate circuit.

Three level arrays are also known. In this circuit topology, one bridge branch consists of four switches. The two central switches are bridged by two series-connected diodes during freewheel times. This circuit has the advantage that the voltage load of the active switches is reduced.

On inverters of this kind, one usually utilizes switches such as IGBTs or MOSFETs.

BRIEF SUMMARY OF THE INVENTION

The object of the invention is to improve at low cost the efficiency of an inverter of the type mentioned.

This object is achieved in that, for mains frequency, one utilizes slow speed switches with little switch drop and equal temperature stability and that for higher clock frequency one utilizes fast speed switches with steeper switching slopes and higher temperature stability, the fast speed switches being arranged so as to be locally separated from the slow speed switches.

Utilizing in parts very high speed switches with very high temperature stability in combination with low speed switches, which are less stable to temperature, the efficiency of the inverter can be further improved at relatively low costs.

The inverter of the invention is very well suited for feeding effective power from a DC source, e.g., from photovoltaic modules or fuel cells, into an electric grid, using components operating at different speeds.

The invention relies on the observation that, in the course of component development, one must reckon with switches operating at faster speed but also with higher admissible operating temperatures for these switches. It is expected that the degree of efficiency will significantly increase. Component parts made from silicon (Si), such as for example Si-IGBTs or Si-MOSFETs, and in particular component parts made from silicon carbide (SiC), are particularly concerned by this development.

Very little switch losses are associated with very steep switching slopes. However, the extreme switching slopes require particular care when devising the commutation circuits. The parasitic inductance of the commutation circuits must adopt minimum values or be restricted in its effect. Local separation of slow speed and fast speed switches combined with supporting capacitors for the commutation voltage make it possible to obtain in a simple manner a circuit having low parasitic inductance.

If switches of different development generations, which are characterized by different temperature stability, are utilized in one circuit, this is taken into account in their spatial arrangement. It is only thanks to the local separation that the advantages of a higher admissible operating temperature can be made use of. At the same time, the demand for low parasitic inductance is taken into account. The parasitic inductance is the smaller, the shorter the feed lines between the switching component parts. The local separation of the various switches allows for short feed lines for the commutation voltage in the event of asymmetric clocking.

Accordingly, the object of the invention is practically achieved by the fact that the commutation circuits are constructed with switches operating at the same speed and exhibiting the same temperature stability. This is readily possible in particular when the circuit is clocked asymmetrically.

The fast speed switches having the same high temperature stability are arranged so as to be locally separated from the slow speed switches having less temperature stability. As a result, higher operating temperature can be ensured for the fast speed switches. The advantage of higher operating temperature may thus be made use of. It needs less expense to dissipate the generated heat.

The switches participating in the commutation processes may again be arranged in close spatial proximity to each other so that the parasitic inductance in the commutation circuit is limited to minimum values.

Through the invention, EMC problems are minimized by the use of the switch properties and the electrical connection according to the invention of the component parts.

Other advantageous embodiments of the invention are recited in the dependent claims.

A particular advantage is obtained if the slow speed switches are disposed in a first component assembly whilst the fast speed switches are disposed separately in a second component assembly. Accordingly, the switches operating at faster speed and exhibiting higher temperature stability form a first component assembly. The switches operating at slower speed and exhibiting less temperature stability form a second component assembly. Both component assemblies are built separately from each other. This allocation allows both for good thermal separation and for low parasitic inductance.

In an advantageous development of the inverter of the invention, there is provided that for the fast speed switches and for the slow speed switches there are respectively provided different cooling elements or mounting surfaces that are thermally separated from each other and on which the switches are mounted. The mounting with discrete component parts occurs in particular on two cooling elements, the first component assembly being disposed on the first cooling element and the second component assembly, on the second cooling element. As a result, separate mounting is possible on the one side and on the other side the various switches are thermally decoupled. This means that switches may be utilized, which exhibit low temperature stability or low temperature limit values without the need for oversized cooling elements. The cooling elements can be optimally adapted to the switches. Through these switches and the separated cooling elements, high efficiency can be achieved in spite of small dimensions and low costs. In principle, such a structure is possible with discrete component parts. The advantage hereby is that two different cooling elements of different efficiency can be used. Practically, the cooling elements are thermally isolated or decoupled from each other such as by an air gap.

Improved efficiency can be achieved if, according to a preferred embodiment of the invention, the switches are integrated in assembly modules, the switches being preferably configured to be chips inside one module. The mounting in an assembly module with at least two substrates minimizes parasitic inductances, the first component assembly being disposed on the first substrate and the second component assembly on the second substrate. A particular low parasitic inductance is achieved because the circuit arrangement is integrated into an assembly module since the switches are disposed in the form of chips inside such a module in particularly close proximity to each other so that conductor paths and bond wires can be kept very short. Using discrete component parts, each switch, i.e., chip, is separately packaged. This means that inside the housing there are located conductor paths and bond wires and outside the housing or housings there are located additional conductor paths on a circuit board, which is external for example.

Another advantageous development of the invention is characterized in that at least one additional supporting capacitor is connected close to the fast speed switches. Preferably, the supporting capacitor is provided in the first component assembly of the fast speed switches. This capacitor additionally limits the voltage above the fast speed switches. By inserting an additional supporting capacitor as close as possible to the fast switching component parts, overvoltage peaks occurring during switching can be reduced.

Moreover, it is particularly advantageous that the fast speed switches are configured to be SiC component parts. If the commutation circuit consists only or partially of the fast speed SiC component parts with very high temperature stability, this means that the fast speed commutation circuit can in principle be heated stronger than the slow speed region. Through short switching times, very high clock frequencies can be achieved. As a result, efficiency is considerably improved.

Advantageously, the slow speed switches are configured to be Si component parts, such as MOSFET or IGBT switches. These switches are sufficient since they are clocked at a relatively low frequency, namely at the mains frequency. They have proved efficient on photovoltaic inverters.

When clocking is asymmetric, the best combination is a combination of MOSFET or IGBT switches with SiC-JFETs.

In order to even further improve efficiency, there is moreover provided that a decoupling switch is connected between the direct voltage source and the bridge circuit, said decoupling switch being synchronized with the fast speed switches. Through this decoupling, high-frequency currents, which are disadvantageous on photovoltaic modules because of their capacity to ground, are reduced.

Alternatively, several decoupling switches, in particular two decoupling switches, can be provided inside the bridge.

The decoupling switches advantageously are SiC components parts, in particular SiC-FETs, because they are triggered at the same clock frequency as the fast speed switches of the bridge.

Another advantage is obtained by switching fast freewheel diodes to the low speed switches or to the MOSFETs or IGBTs, which are however locally associated to the fast speed switches or the SiC switches. Therefore, freewheel diodes configured to be Schottky diodes are connected parallel to the slow speed switches. During the freewheel phases, which follow each other at high frequency, fast switching of the diodes has an effect of benefit on efficiency.

In order to improve efficiency, the inverter is advantageously configured to be a multi-level inverter, in particular a three level inverter.

An implementation as a photovoltaic inverter is particularly relevant. Here, the efficiency of a current generating plant is very important. Good EMC (electromagnetic compatibility), capacitive leak currents of the photovoltaic modules and a compact construction play a major part for commercializing the products.

A photovoltaic inverter is significantly improved by the invention. For further optimization of such inverters increase in efficiency and reduction of the production costs are of paramount importance.

An exemplary embodiment will be discussed in closer detail with reference to the drawings and further advantageous developed embodiments of the invention and advantages thereof will be described.

BRIEF DESCRIPTION OF THE SEVERAL VIEWS OF THE DRAWINGS

In said drawing:

FIG. 3a shows the structure of the circuit arrangement as shown in FIG. 1 or in FIG. 2 with discrete component parts, FIG. 3b shows the structure from the side, FIG. 5e shows in embodiment of the topology shown in FIG. 4 in a semiconductor module with two substrates, FIG. 7a shows an embodiment of the circuit topology shown in FIG. 6 with discrete switches distributed on two cooling elements, FIG. 7b shows the arrangement as shown in FIG. 7a when viewed from the side.

DETAILED DESCRIPTION OF THE INVENTION

Figure 1:
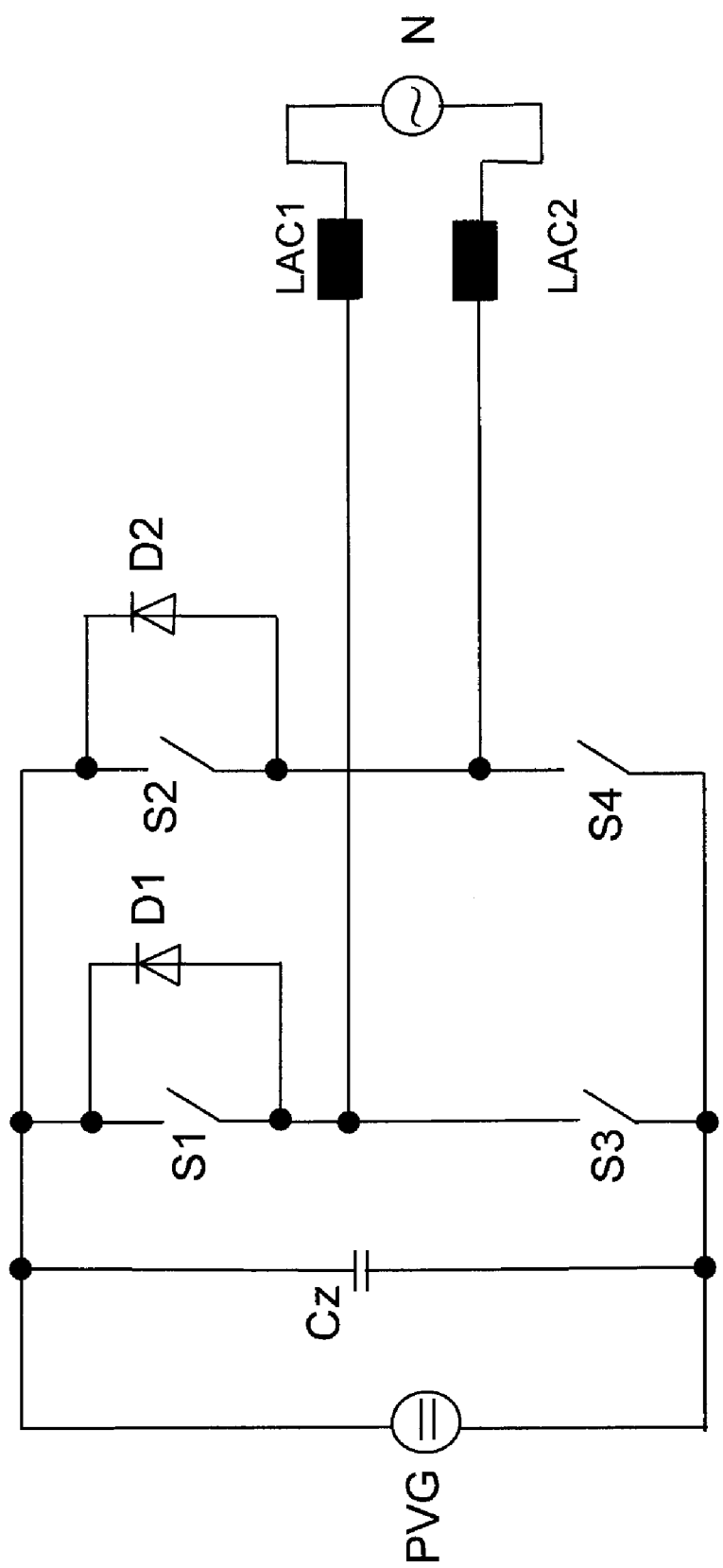
FIG. 1 shows a full bridge for feeding into an AC mains from a DC source.

FIG. 1 shows a full bridge for feeding into an AC mains N, preferably in the grid, from a DC source or from a direct voltage source, in particular from a photovoltaic generator PVG.

The generator PVG feeds the full bridge consisting of four switches S1, S2, S3 and S4. These switches are semiconductor switches, two first, upper switches S1, S2 and two second, lower switches being provided. The term "upper and lower switches" only serves for better understanding. In principle, the switches S3, S4 may also be switched at the top, meaning at the positive pole. Although the circuit is shown in a one-phase configuration, it may also be three-phase with six switches, meaning three upper and three lower switches.

Parallel to the generator PVG, a capacitor Cz is mounted as a buffer. Furthermore, the circuit incorporates two power chokes LAC1 and LAC2. The circuit is configured to be one-phase. The bridge is clocked asymmetrically. The first or upper switches S1, S2 are clocked at mains frequency, meaning at another frequency than the second or lower switches S3, S4, which are clocked at a high frequency of in particular at least or more than 1 kHz, preferably of more than 5 kHz.

Because the arrangement is clocked asymmetrically, one diode D1 is connected antiparallel to the upper switch S1 and one diode D2 is connected antiparallel to the upper switch S2. During the positive half wave of the mains voltage, the switch S1 is closed and the switch S4 is clocked at high frequency. If the lower switch S4 is closed, a current flows via an upper switch S1 and via the lower switch S4 as well as via the mains chokes LAC1 and LAC2 into the AC mains N, in particular into a grid. This grid may also be an isolated network. If the switch S4 is open, a freewheel circuit forms. The current flows into the grid via the upper switch S1, the diode D2 and the two mains chokes LAC1 and LAC2.

During the negative half wave of the mains voltage, the other upper switch S2 is closed, the lower switch S3 being clocked at high frequency. If the lower switch S3 is closed, a current flows into the grid via the upper switch S2 and via this switch S3 as well as via the two mains chokes LAC1 and LAC2. A freewheel circuit forms when the lower switch S3 is open. It is formed from the upper switch S2, the diode D1 and the chokes LAC1, LAC2 and the mains N. Accordingly, an analogous freewheel circuit occurs when the other lower switch S4 is open.

The arrangement shown in FIG. 1 incorporates at least partially fast switching component parts such as semiconductor switches and diodes, in particular SiC-JFET. The second or lower switches S3 and S4 are configured to be fast speed switches such as self-conducting SiC-JFET. For the first upper switches S1 and S2, conventional switches such as MOSFETs or IGBTs, which are made from silicon, are utilized. However, a particular advantage is obtained if the upper switches S1 and S2 are IGBTs. Then, very fast switching diodes such as SiC Schottky diodes may be also used for the freewheel diodes D1 and D2. As a result, particularly high efficiency can be achieved.

With the circuit shown in FIG. 1 and with the described choice of switches, a short circuit of the DC side is avoided. The AC side, meaning the mains side, is isolated with a mains relay for reasons of protection when the apparatus is switched off, so that a short circuit is generated. Adding the mains to the circuit and removing it therefrom occurs through operating management.

In accordance with the invention, the fast speed switches S3, S4, meaning the SiC component parts, are locally separated from the Si component parts or from the low speed switches S1, S2. The advantage thereof is that the Si switches S1, S2 can be arranged in close proximity to each other. Through this provision, parasitic inductances can be minimized. Another advantage is that each Si or SiC component area can be exposed to other conditions, such as to other temperatures. The SiC switches S3, S4 may for example be operated at much higher temperatures. The lower switches S3, S4 as well as the diodes D1 and D2 are fast speed and highly temperature resistant.

For mains frequency, one accordingly utilizes slow speed switches S1, S2 exhibiting the same temperature stability and for higher clock frequency one utilizes fast speed switches S3, S4 with steeper switching slopes and higher temperature stability, the fast speed switches S3, S4 being arranged so as to be locally separated from the slow speed switches S1, S2.

The slow speed switches S1, S2 are more specifically disposed in a first component assembly whilst the fast speed switches S3, S4 are disposed spatially in a second component assembly.

Figure 2:
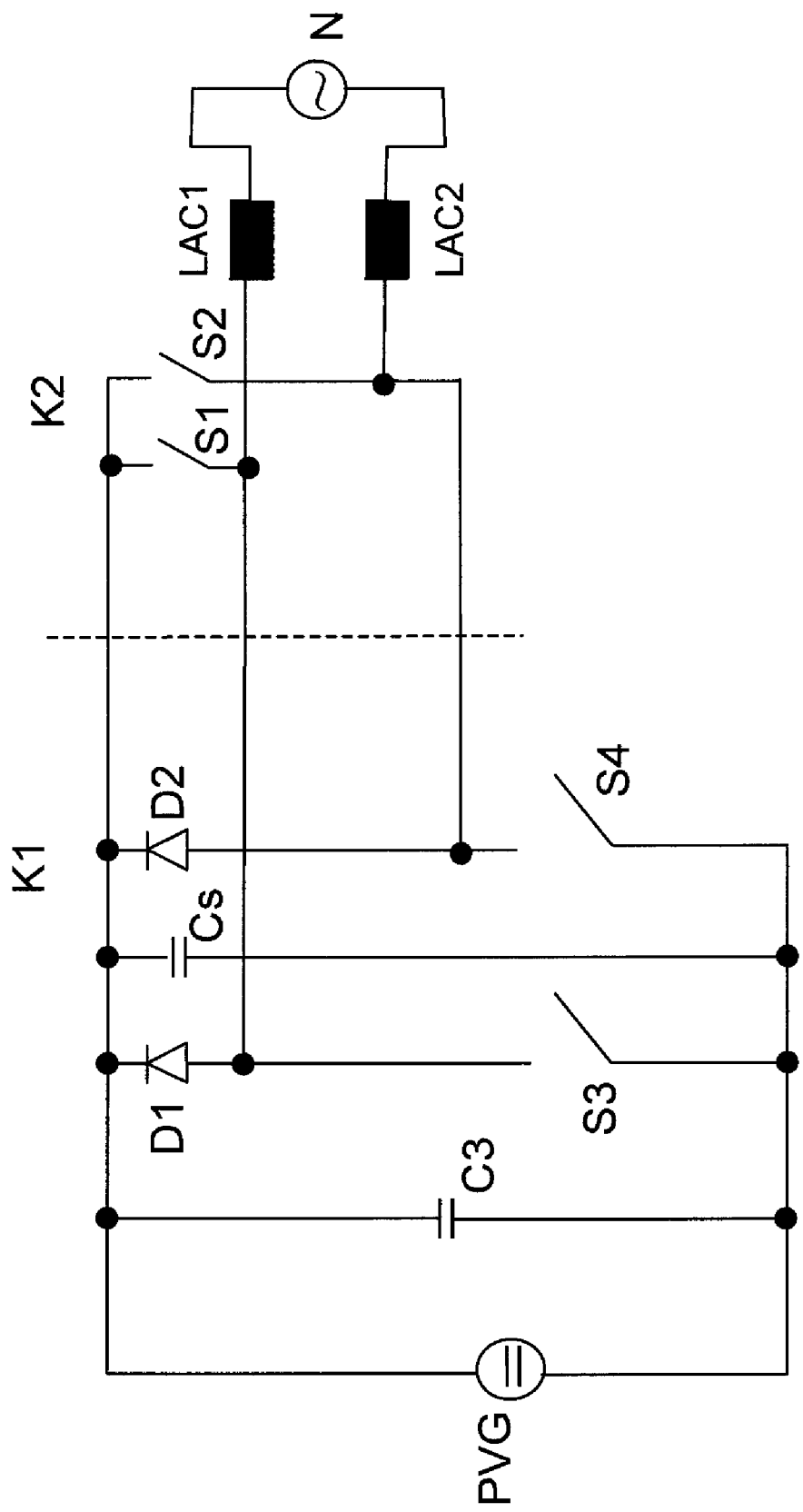
FIG. 2 shows the full bridge as shown in FIG. 1 with locally separated regions for fast speed and for slow speed switches.

FIG. 2 shows how the component parts are to be arranged spatially. The arrangement widely corresponds to the circuit shown in FIG. 1. The commutation circuits, which are clocked at high frequency and which consist on the one side of the diode D1 and of the lower switch S3 and on the other side of the diode D2 and of the other lower switch S4, form a component assembly. The switches S1 or S2, which are clocked at mains frequency, form a second component assembly (see dashed line).

Parallel to the two branches, which consist on the one side of the diode D1 and of the lower switch S3 and on the other side of the diode D2 and of the other lower switch S4, there is connected additionally a supporting capacitor Cs, in proximity to the fast speed switches S3, S4.

Through the supporting capacitor Cs the voltages are prevented from building up to high values on the semiconductor switches, due to the parasitic inductances. Each connection in the illustrated topology can be associated with a parasitic inductance Ls. The shorter these connections the smaller the parasitic inductance Ls.

During switching, the parasitic inductance causes an additional voltage $Us = Ls \times di/dt$. As a result thereof, the component parts are more loaded. Higher switching losses occur and the switches must be devised for the resulting voltage. The additional induced voltage Us is the higher the faster the switches, meaning the higher the current increase di/dt. Therefore, it is important to keep the parasitic inductances for fast speed switches as low as possible.

The switches are clocked asymmetrically, at high frequency at one pole. Through unipolar clocking, one obtains a commutation circuit that is only closed through the fast switching component parts, namely the diode D1 and the lower switch S3 or the diode D2 and the other lower switch S4, so that it must not be coupled spatially to the low speed switches S1 or S2. Spatial separation of fast and slow switching component parts can be achieved in different ways, for example by discrete component parts on different cooling elements and/or inside one semiconductor module. A combination of discrete component parts and semiconductor modules is also possible. Discrete switches S1, S2 and semiconductor module switches S3, S4 may for example be utilized.

FIG. 3a and FIG. 3b show the structure of the circuit shown in FIG. 1 or in FIG. 2 with discrete component parts. The component assemblies are advantageously disposed on various cooling elements K1, K2. The fast speed switches S3, S4 and the diodes D1, D2 are thermally connected to the cooling element K1. The slow speed switches S1, S2 are connected to the cooling element K2. The cooling element K1 of the fast speed switches S3, S4 is e.g., larger than the cooling element K2 of the low speed switches S1, S2. The cooling elements K1, K2 are disposed side-by-side. Above the switches and diodes mounted on the cooling elements K1, K2, there is located a printed circuit board P with a layout. The connecting pins AP of the switches and diodes are electrically connected, such as soldered, to the conductor paths of the printed circuit board P.

Figure 3C:
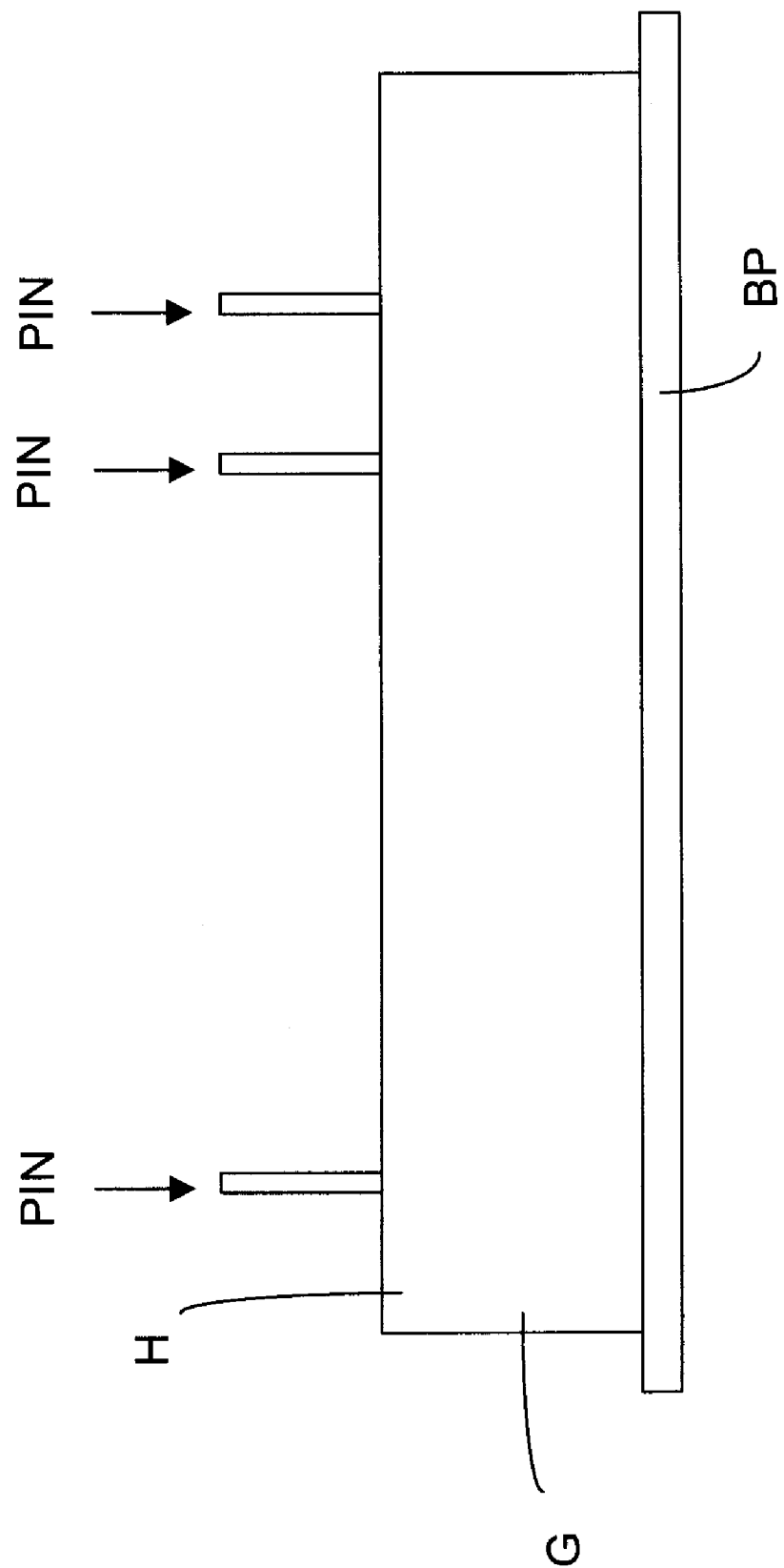
FIG. 3c shows an illustration of a semiconductor module as shown in FIG. 3e when viewed from the side.
Figure 3D:
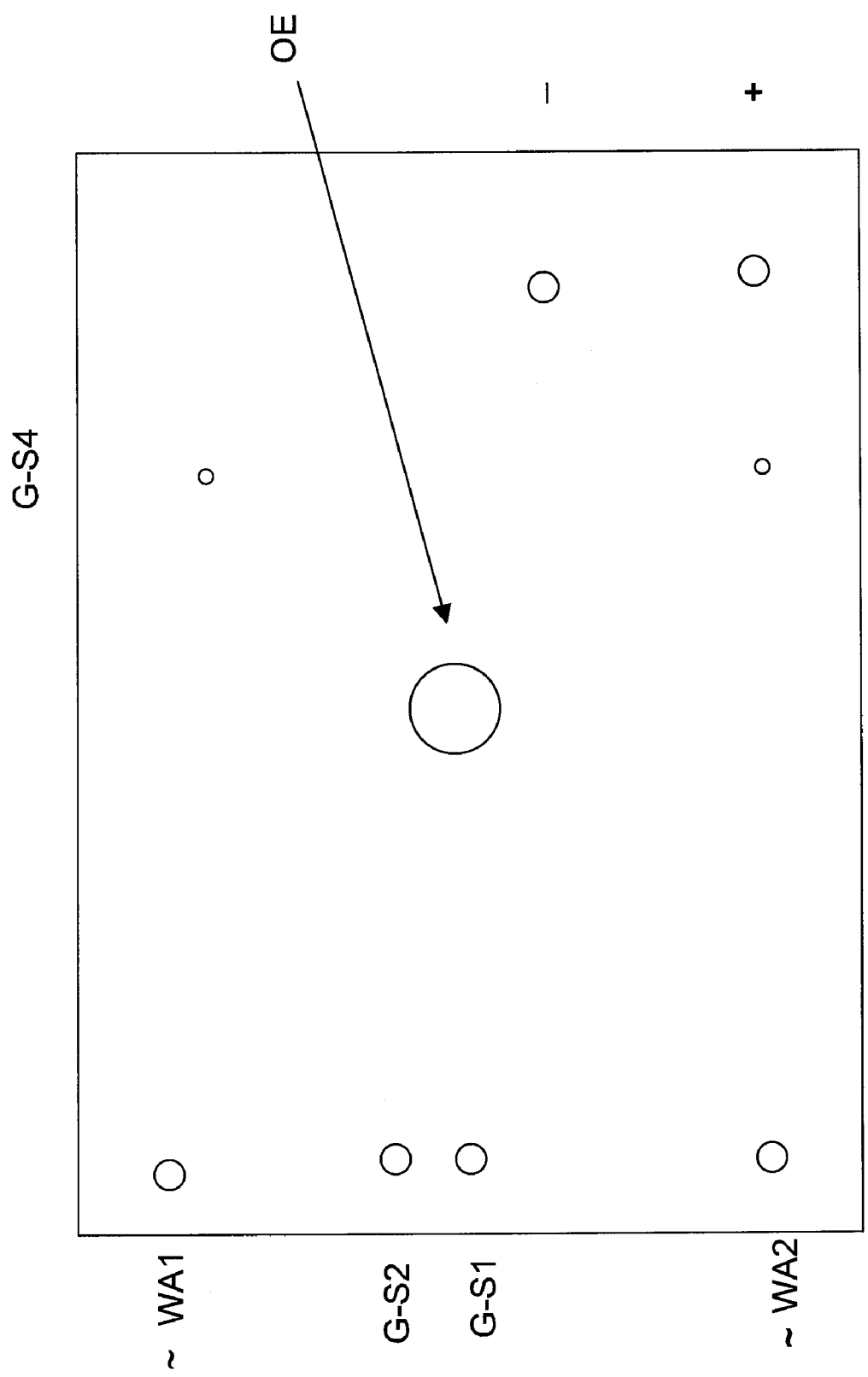
FIG. 3d shows an illustration of the semiconductor module when viewed from the bottom.
Figure 3E:
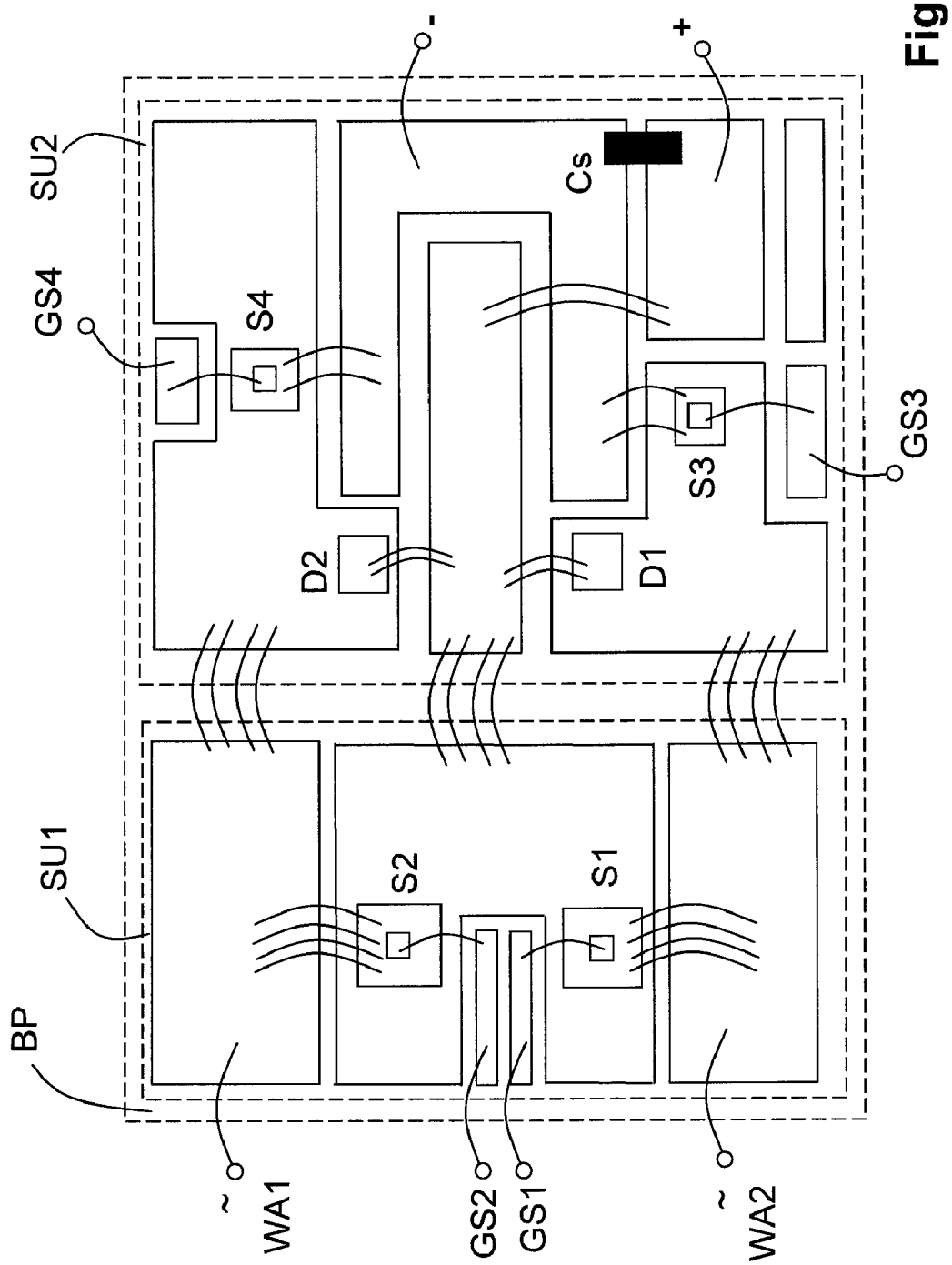
FIG. 3e shows an implementation of the arrangement as shown in FIG. 1 or in FIG. 2 in a semiconductor module with two substrates.

The FIGS. 3c through 3e show a housing G and the layout for two substrates SU1, SU2 of an assembly module, in particular of a semiconductor module H. It is understood that commercially available housings may also be used. The slow speed switches S1 and S2 are soldered onto the substrate SU1. From this substrate extend the AC terminals WA1 and WA2 as well as the control terminals GS1 for the upper switch S1 and GS2 for the other upper switch S2. The fast speed switches S3 and S4 are soldered onto the substrate SU2. From this substrate extend the DC terminals + and − as well as the control terminals GS3 for the lower switch S3 and GS4 for the other lower switch S4. The supporting capacitor Cs is also soldered onto the substrate SU2. Here, Cs is for example configured to be an SMD component part. Other embodiments may also be used. In FIG. 3e, all the switches S1 through S4 or all the diodes D1 and D2 are each configured to be a chip. Each switch or each diode can also be configured by several parallel-connected chips.

Pins PIN are soldered onto copper surfaces for the connections. Alternatively, bond wires may lead to pin connections which are plugged in a plastic frame for example.

The substrates SU1, SU2 are soldered to a joint bottom plate BP. The plastic housing G is glued to the bottom plate BP that is provided with through bores for the pins PIN and into which an isolation material is introduced into the interior of the housing through another opening OE. Preferably, this is a soft grouting.

Alternatively, a plastic frame into which the connecting pins PIN are being plugged may be placed onto the bottom plate BP. The module is filled with isolating material and is closed with a lid such as by gluing.

The principle of spatial separation and of introducing an additional supporting capacitor Cs may also be used on other circuit topologies. Beside the already described full bridge, the arrangements described in prior art with at least one decoupling element, for example according to DE 10 2004 030 912 B3, or according to the essay of Gonzales or according to the three-level topology mentioned, also belong thereto.

Figure 4:
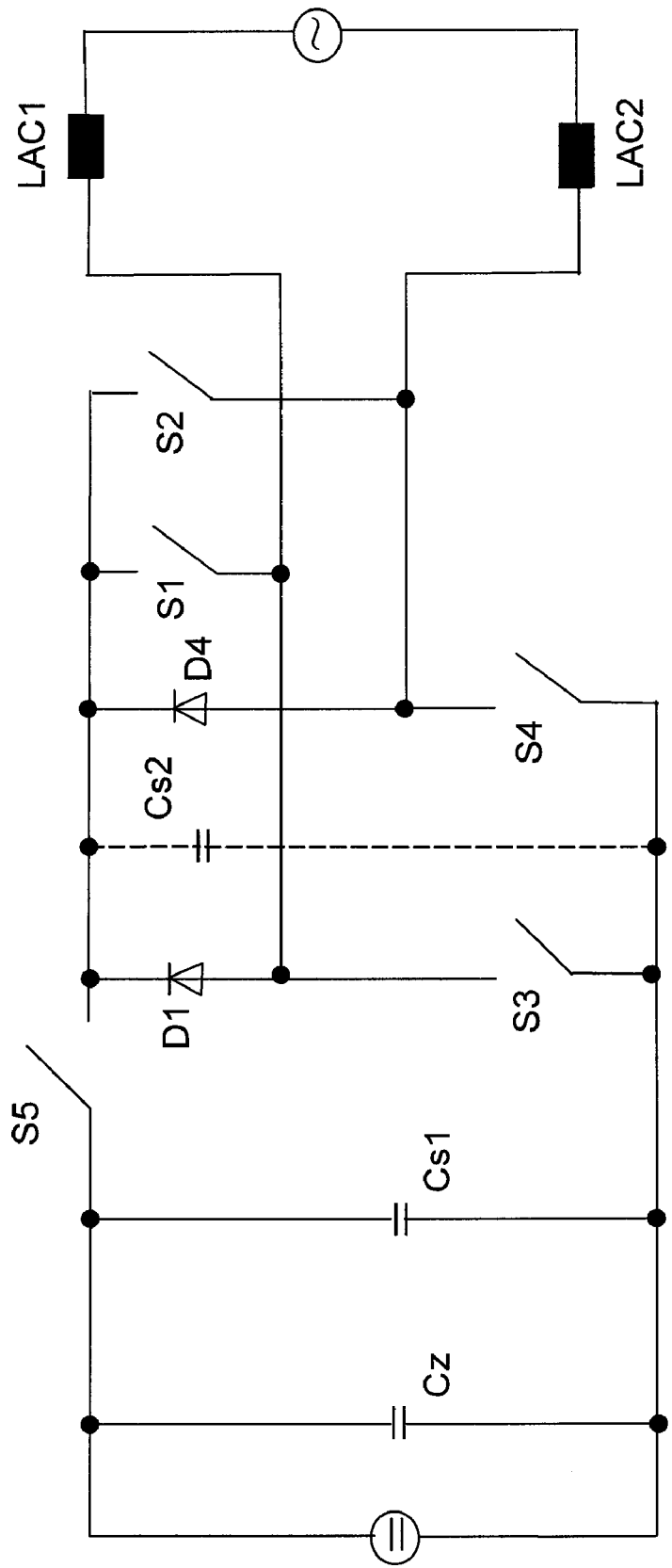
FIG. 4 shows a circuit for feeding into a grid from a DC source with an additional decoupling switch.

FIG. 4 shows an arrangement for feeding from a DC source, in particular from a photovoltaic generator (PVG), into a grid with an additional decoupling switch S5. The lower switches S3, S4 and the additional switch S5 as well as the diodes D1 and D2 are fast switching and highly resistant to temperature. These component parts form the first component assembly. A first supporting capacitor Cs2 is connected in analogous fashion to the previous example. A second supporting capacitor Cs1 is disposed parallel to the buffer capacitor Cz. The second supporting capacitor Cs1 is however smaller, in particular much smaller than the buffer capacitor Cz. In the first component assembly, the second supporting capacitor Cs1 is disposed close to the switches S3, S4. In another embodiment, the supporting capacitor Cs2 can also be disposed parallel to the bridge branches as shown in FIG. 2. For this variant, a supporting capacitor Cs2 is shown in a dashed line in FIG. 4.

The upper switches S1 and S2 in FIG. 4 are the slow speed and less temperature resistant switches and form the second component assembly.

Activation occurs asymmetrically just like in the circuit shown in FIG. 1 or in FIG. 2. In contrast thereto, the fifth switch S5 is however located before the bridge. Said fifth switch switches at the same time at high frequency and in synchronism with a respective one of the lower switches S3 or S4.

Figure 5B:
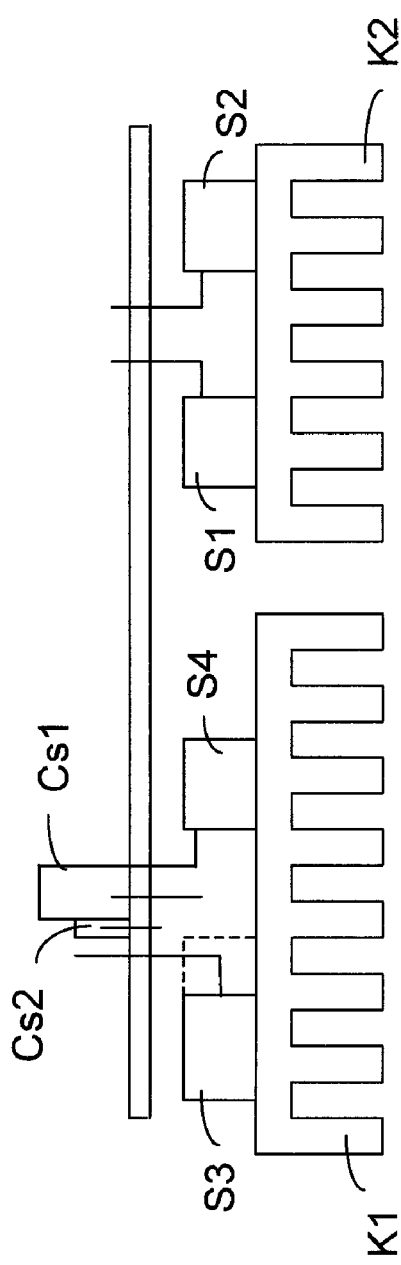
FIG. 5b shows the arrangement as shown in FIG. 5a from the side.
Figure 5A:
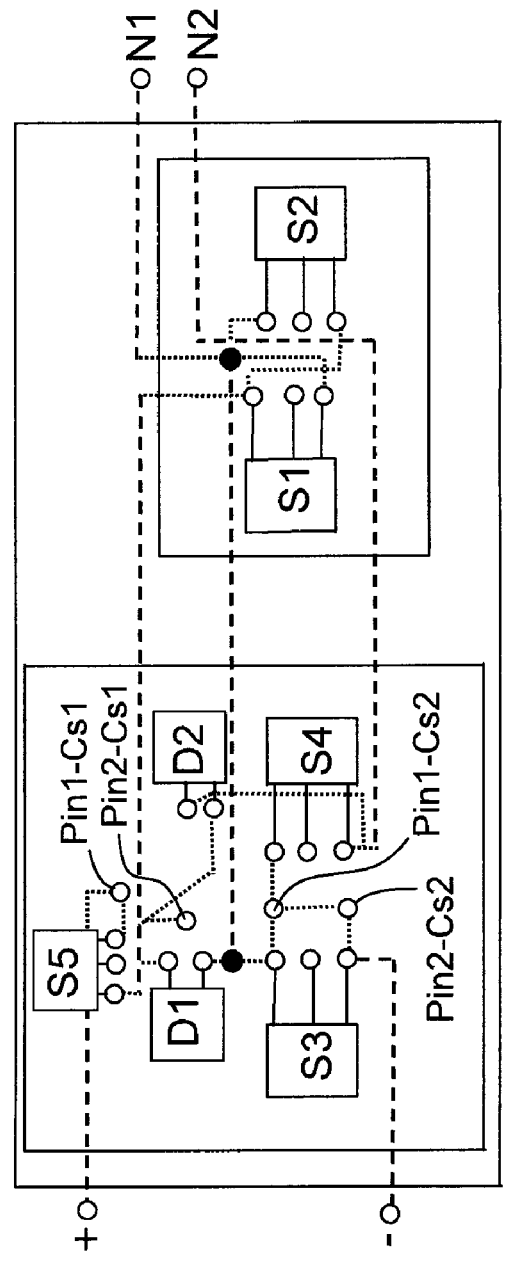
FIG. 5a shows an implementation of the arrangement of the circuit topology shown in FIG. 4 with discrete switches distributed on two cooling elements.

FIG. 5a and FIG. 5b show an implementation of the topology shown in FIG. 4 with discrete switches distributed on two cooling elements K1, K2. The structure is almost identical to the one shown in FIG. 3a. In contrast to the implementation shown in FIG. 3a, the fifth switch S5 is additionally disposed on the cooling element K1.

Figure 5C:
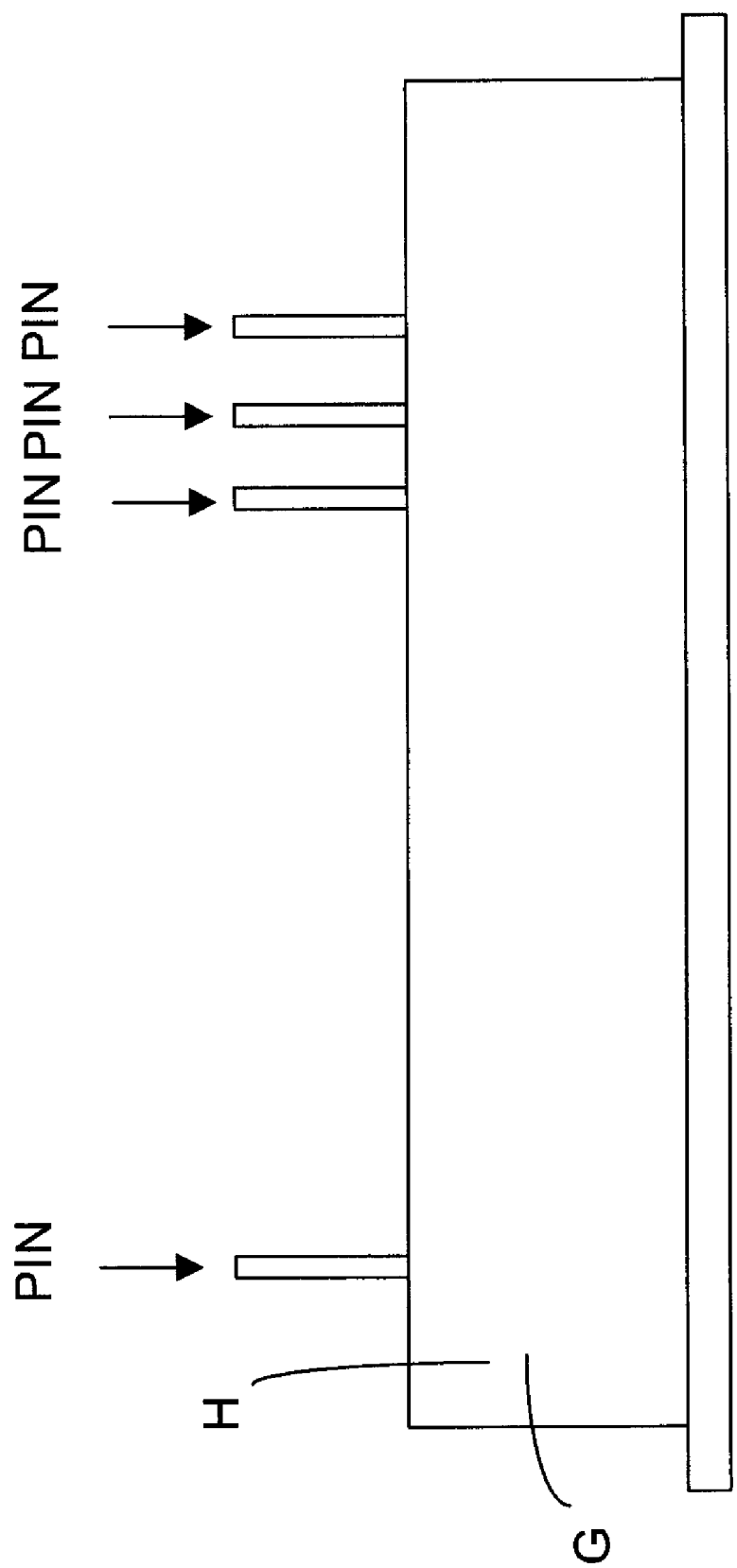
FIG. 5c shows an illustration of the semiconductor module as shown in FIG. 5e when viewed from the side.
Figure 5D:
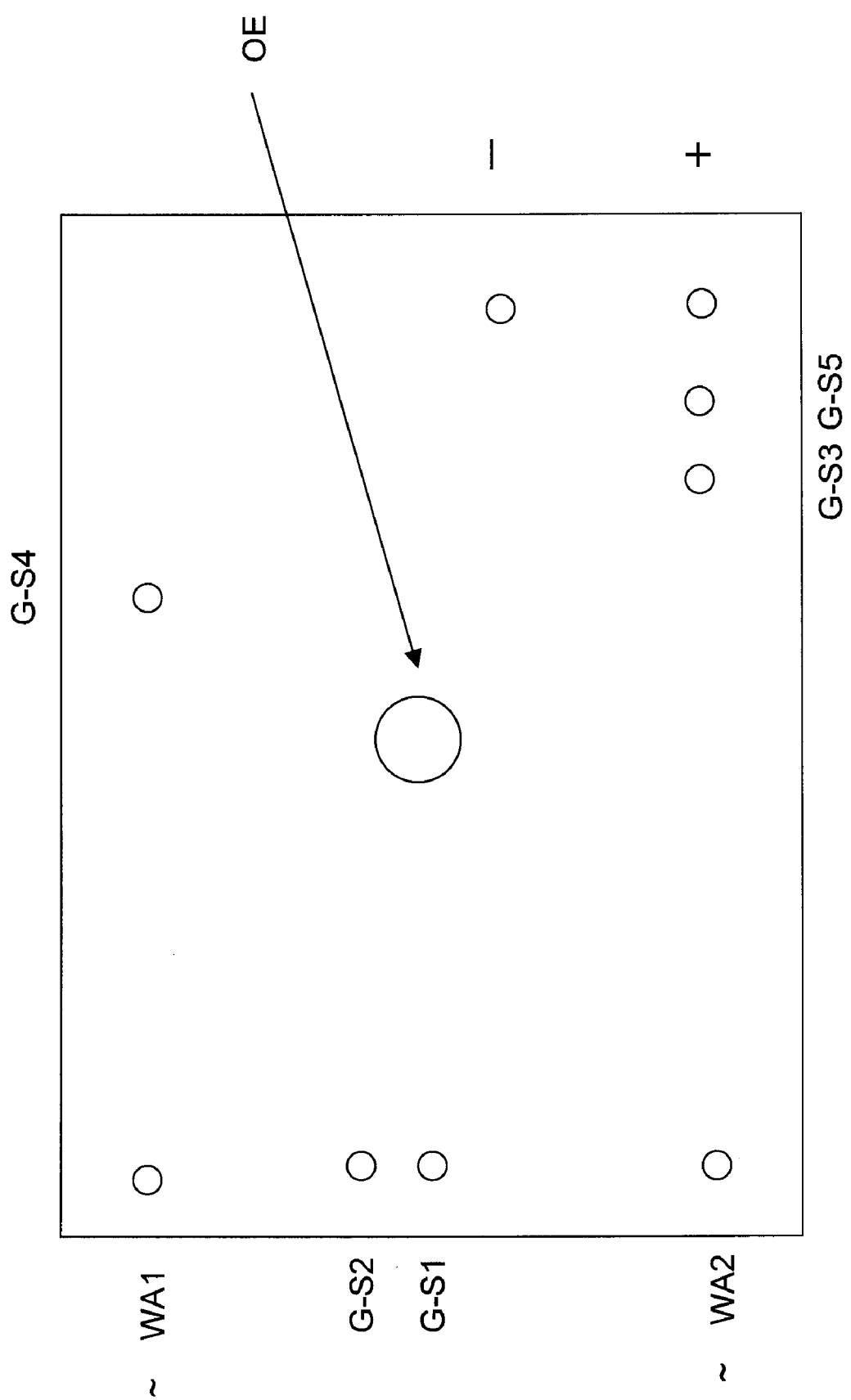
FIG. 5d shows an illustrations of the semiconductor module shown in FIG. 4e when viewed from the bottom.

The FIGS. 5c through 5e show an implementation of the circuit topology shown in FIG. 4 in an assembly module, in particular in a semiconductor module H, with two substrates SU1, SU2. The structure is almost identical with the structure shown in the FIGS. 3c through 3e. In contrast to this structure, the switch S5 is additionally disposed on the substrate SU2. As a result, the module also has another terminal, namely a control terminal GS5 for the fifth switch S5. This circuit is referred to as a H5 bridge. The bottom plate BP is preferably made from metal.

Figure 6:
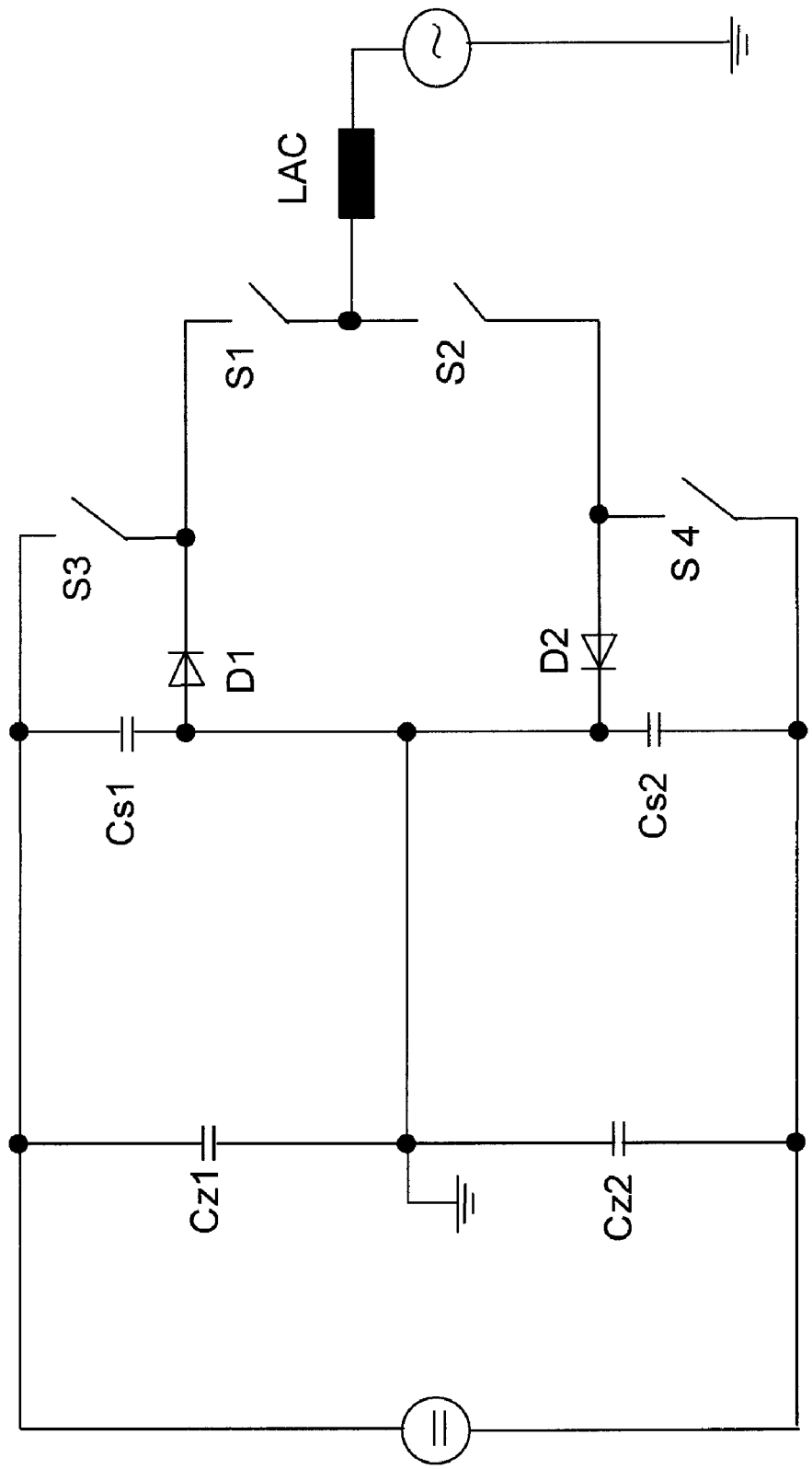
FIG. 6 shows a one-phase three-level arrangement for feeding into a grid from a DC source.

FIG. 6 shows a multi-level circuit, in particular a three-level circuit, for one-phase feeding into the grid N with the DC source or the photovoltaic generator PVG. The circuit consists of a divided intermediate circuit, which means that two capacitors Cz1 and Cz2 are connected in series. The center point is grounded.

Parallel to the intermediate circuit there is disposed a bridge branch. This bridge branch consists of four series connected switches S1 through S4. The switches S1, S2 are disposed inside, the switches S3, S4, outside.

Parallel to the two central switches S1 and S2 of the bridge branch there are disposed to series connected diodes D1 and D2. The connecting point of these diodes is connected to the grounded center point of the intermediate circuit. Preferably, two supporting capacitors Cs1 and Cs2 are provided in the arrangement. The capacitor Cs1 is connected parallel to the series connection consisting of the switch S3 and of the diode D1 and the capacitor Cs2 is connected parallel to the series connection consisting of the switch S4 and of the diode D2.

The switches are also clocked asymmetrically. The switches S1 and S2 are triggered at mains frequency. During the positive half wave of the alternating voltage on the output side, the switch S1 is closed, whilst the switch S3 is clocked at high frequency. If the switch S1 is closed, a current flows through the switches S3, S1 and the mains choke LAC into the grid N. If the switch S3 is open, a current flows through the freewheel circuit, with the components S1, D1 and ground.

During the negative half wave of the alternating voltage on the output side, the switch S2 is closed and the switch S4 is clocked at high frequency. The freewheel circuit is then formed through the components S2, D2 and ground.

The FIGS. 7a and 7b show an embodiment of the topology shown in FIG. 6 with discrete switches distributed on two cooling elements K1 and K2.

Figure 7C:
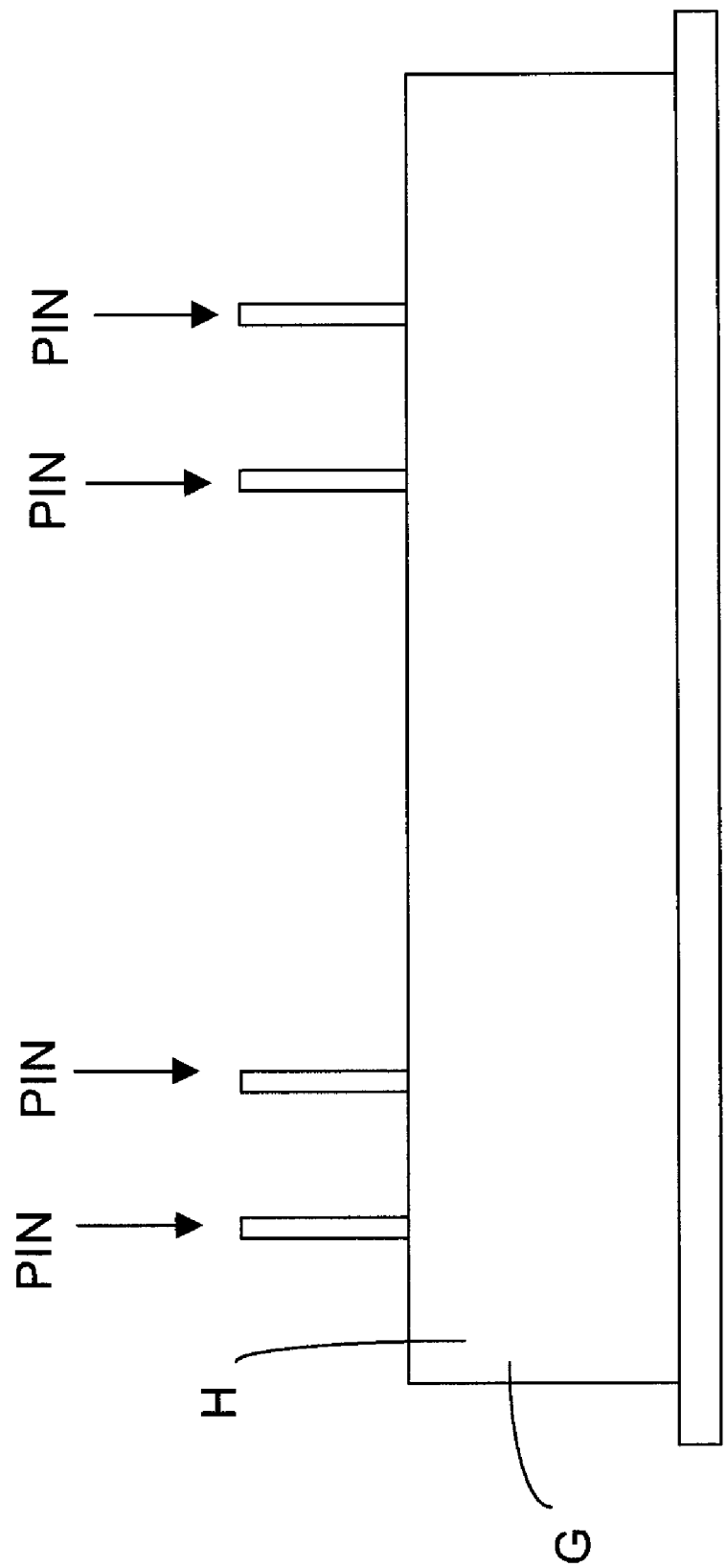
FIG. 7c shows an illustration of the semiconductor module as shown in FIG. 7e when viewed from the side.
Figure 7D:
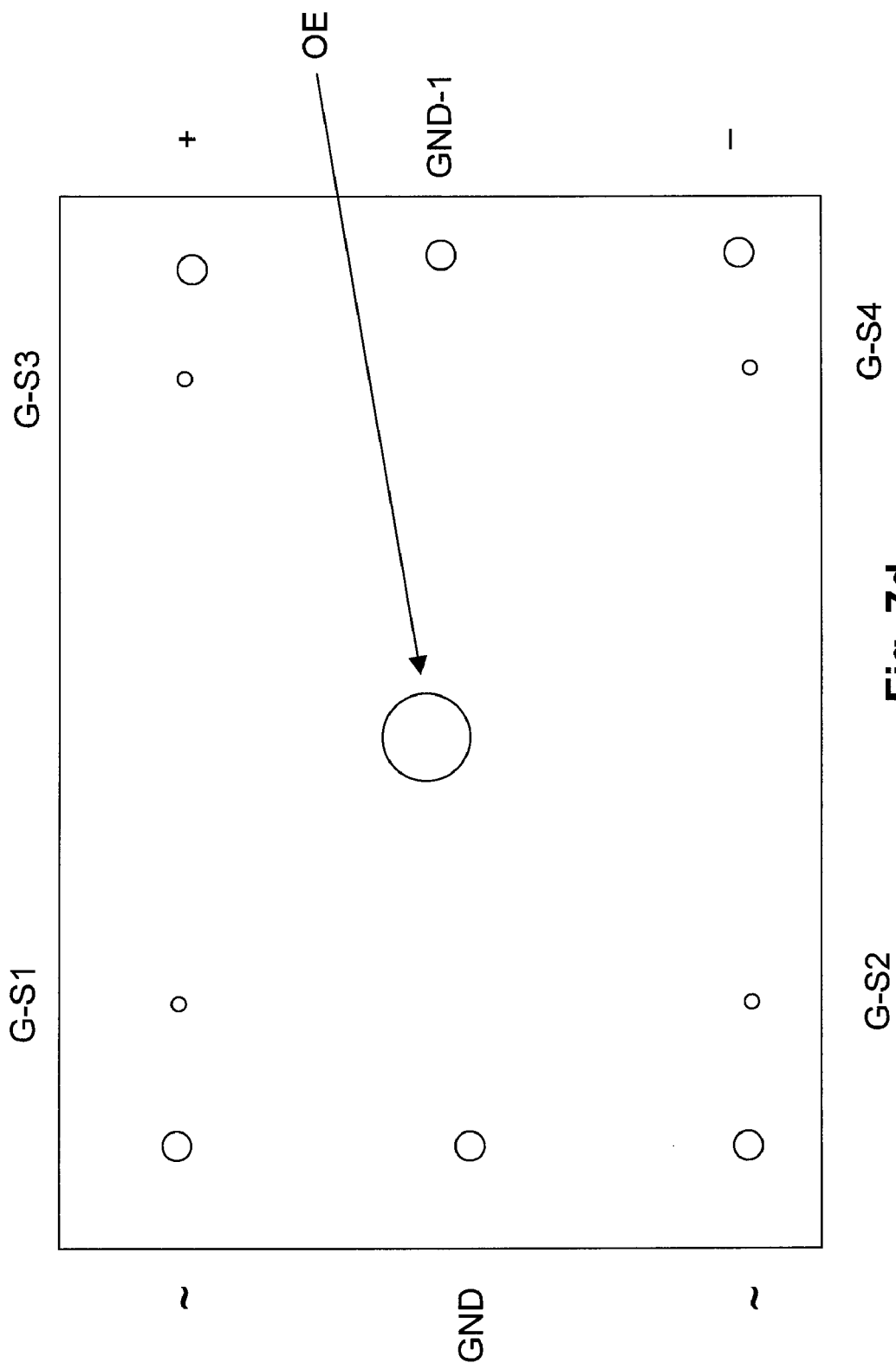
FIG. 7d shows an illustration of the semiconductor module as shown in FIG. 7e when viewed from the bottom.
Figure 7E:
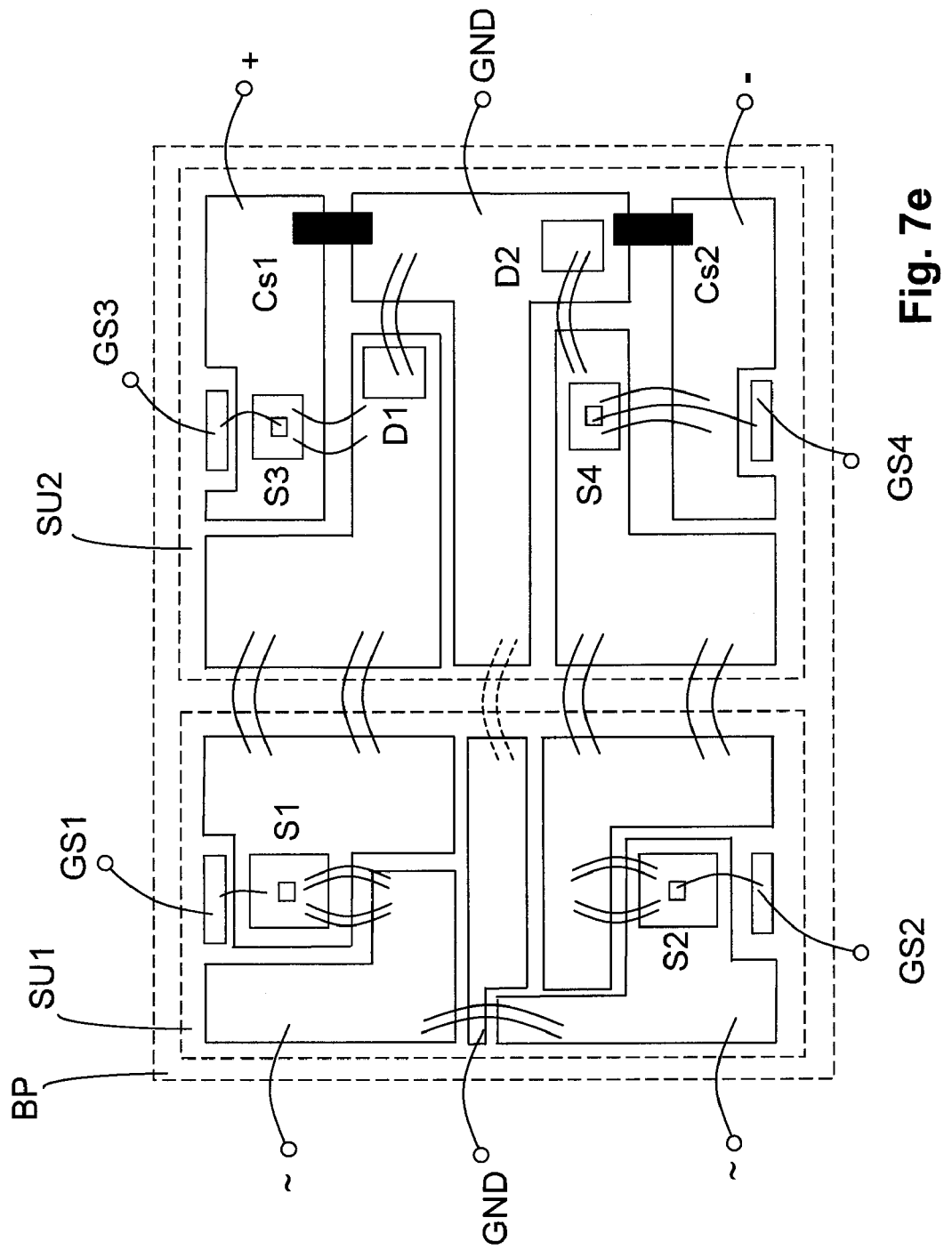
FIG. 7e shows an embodiment of the circuit topology shown in FIG. 6 in a semiconductor module with two substrates.

The FIGS. 7c through 7e show an embodiment of the topology shown in FIG. 6 in an assembly module, preferably in a semiconductor module H. The module is of a construction similar to that for the full bridge or for the H5 bridge. One difference is the arrangement and the definition of the connecting pins PIN as shown in the Figs. This module as well is built with two substrates SU1 and SU2. The substrate SU1 incorporates the slow speed switches S1, S2 exhibiting low temperature stability. The substrate SU2 incorporates the fast speed switches S3, S4 exhibiting high temperature stability. The grounding points GND of the substrates SU1 and SU2 can be joined together internally by bonds. Since this may occur optionally, this connection is shown in a dashed line. If several such modules are connected in parallel, feeding may occur in several phases. Each switch is represented by a chip in FIG. 7e. A parallel connection of several chips for increasing the current carrying capacity is possible.

For all the examples, first switches S1, S2 having the same temperature stability are utilized for the mains frequency and switches S3, S4 operating at faster speed, with steeper switching slopes and higher temperature stability are utilized for the higher clock frequency, the first switches S1, S2, which are referred to herein by way of example as upper switches, being arranged so as to be spatially separated from the second switches S3, S4, which are referred to herein by way of example as lower switches.

The invention is not limited to these examples; features that have been shown or described may be combined ad lib. The circuits shown in FIG. 4 or in FIG. 6 may also be three-phase for example. Other bridge circuits with another circuit arrangement and/or another number of switches and/or with other freewheel diodes may be combined with the invention. The circuits may preferably be transformerless. Solutions with one transformer are also possible, though. Boost and/or buck converters, MPP controls, pulse-width controls and other current methods may be used.

The invention claimed is:

1. An inverter, comprising:
 a half-bridge circuit, comprising:
  four switches connected in series between first and second DC input terminals of the inverter, wherein the four switches further comprise:
   first and second inner switches connected together at an output node of the inverter, wherein the first and second inner switches are configured to switch at a first frequency associated with a mains frequency;
   first and second outer switches, wherein the first outer switch is coupled between the first inner switch and the first DC input terminal, and wherein the second outer switch is coupled between the second inner switch and the second DC input terminal, and wherein the first and second outer switches are configured to switch at a second frequency that is greater than the first frequency;
  an intermediate circuit comprising two series-connected capacitances coupled across the first and second DC input terminals, and coupled together at a center node that is coupled to a predetermined potential,
 wherein the half-bridge circuit further comprises:
  a first free-wheeling diode coupled between a node connecting the first inner switch and the first outer switch, and the predetermined potential; and
  a second free-wheeling diode coupled between a node connecting the second inner switch and the second outer switch, and the predetermined potential,
 wherein the first and second inner switches are thermally isolated from the first and second outer switches.

2. The inverter of claim 1, wherein the first and second free-wheeling diodes are thermally isolated from the first and second inner switches.

3. The inverter of claim 2, wherein the first and second free-wheeling diodes are in a same thermal environment as the first and second outer switches.

4. The inverter of claim 1, wherein the first and second inner switches form a first component assembly, and the first and second outer switches form a second component assembly, and wherein the first and second component assemblies are separate from one another.

5. The inverter of claim 4, further comprising first and second series-connected supporting capacitors collectively coupled in parallel with the intermediate circuit, wherein the first and second series-connected capacitors are located spatially in close physical proximity to the first and second outer switches in the second component assembly, thereby minimizing parasitic inductances in the second component assembly.

6. The inverter of claim 4, wherein the first component assembly is thermally coupled to a first heat sink structure, and wherein the second component assembly is thermally coupled to a second heat sink structure, wherein the first and second heat sink structures are thermally isolated from one another.

7. The inverter of claim 4, wherein the first and second free-wheeling diodes form a portion of the second component assembly.

8. The inverter of claim 1, wherein a switching slope of the first and second outer switches is steeper than a switching slope of the first and second inner switches.

9. The inverter of claim 1, wherein the first and second outer switches comprise SiC FETs.

10. The inverter of claim 9, wherein the first and second inner switches comprise silicon MOSFETs or IGBTs.

11. The inverter of claim 9, wherein the first and second free-wheeling diodes comprise SiC Schottky diodes.

12. An inverter, comprising:
 a full-bridge circuit forming an input of the inverter configured to receive a DC input voltage, comprising:
  first and second top switches;
  first and second bottom switches series-coupled to the first and second top switches, respectively, at respective first and second terminals that form first and second output nodes of the inverter;
  first and second free-wheeling diodes coupled in parallel to the first and second top switches, respectively,
 wherein the first and second top switches are configured to switch at a first frequency associated with a mains frequency,
 wherein the first and second bottom switches are configured to switch at a second frequency that is greater than the first frequency, and
 wherein the first and second top switches are thermally isolated from the first and second bottom switches.

13. The inverter of claim 12, further comprising first and second output chokes coupled to the first and second output nodes, respectively.

14. The inverter of claim 12, wherein the first and second top switches form a first component assembly, the first and second bottom switches comprise a second component assembly, and wherein the first and second component assemblies are separate from one another.

15. The inverter of claim 14, wherein the first component assembly is thermally coupled to a first heat sink structure, and wherein the second component assembly is thermally coupled to a second heat sink structure, wherein the first and second heat sink structures are thermally isolated from one another.

16. The inverter of claim 15, wherein the second heat sink structure has a larger heat capacity than the first heat sink structure.

17. The inverter of claim 15, wherein the first and second free-wheeling diodes form a portion of the second component assembly.

18. The inverter of claim 14, further comprising a capacitor electrically connected in parallel to the input of the full-bridge circuit, and located spatially in close physical proximity to the first and second bottom switches in the second component assembly, thereby minimizing parasitic inductances in the second component assembly.

19. The inverter of claim 12, wherein a first node coupled to the first and second top switches, and a second node coupled to the first and second bottom switches form the input of the full-bridge circuit, the inverter further comprising another switch coupled to the first node, wherein the another switch is configured to switch at the second frequency.

20. The inverter of claim 12, wherein a switching slope of the first and second bottom switches is steeper than a switching slope of the first and second top switches.

21. The inverter of claim 12, wherein the first and second bottom switches comprise SiC FETs.

22. The inverter of claim 21, wherein the first and second free-wheeling diodes comprise SiC Schottky diodes.

23. The inverter of claim 21, wherein the first and second top switches comprise silicon MOSFETs or IGBTs.

24. The inverter of claim 12, wherein the first and second free-wheeling diodes are thermally isolated from the first and second top switches.

25. The inverter of claim 24, wherein the first and second free-wheeling diodes are in a same thermal environment as the first and second bottom switches.

* * * * *